United States Patent [19]
Mehra

[11] Patent Number: 5,461,006
[45] Date of Patent: Oct. 24, 1995

[54] METHOD FOR FORMING CONTACTS WITH ANOMALOUSLY LOW RESISTANCE

[75] Inventor: Madhav Mehra, Rochester, N.Y.

[73] Assignee: Eastman Kodak Company, Rochester, N.Y.

[21] Appl. No.: 370,996

[22] Filed: Jan. 10, 1995

Related U.S. Application Data

[63] Continuation-in-part of Ser. No. 16,225, Feb. 11, 1993, abandoned.

[51] Int. Cl.$^6$ .................................................. H01L 21/44
[52] U.S. Cl. ........................................ 437/200; 437/194
[58] Field of Search .................................. 437/194, 200, 437/247

[56] References Cited

U.S. PATENT DOCUMENTS 5,302,549  4/1994  Santangelo et al. ................... 437/188

FOREIGN PATENT DOCUMENTS 6229163  2/1987  Japan.
5198528  8/1993  Japan.

OTHER PUBLICATIONS

H. L. Balbar et al. "Al/SiO$_2$/WSi$_2$/Si double–level metallization for charge—coupled device imagers" J. Vac. Sci. Technol. Nov./Dec. 1985 pp. 1645–1649.

Shinichi Inoue et al. "Tungsten Silcicide/silicon contact layer analysis" Appl. Ion Beams Mater. Sci. Proc. Int. Symp. Hosei Univ 12th Meeting (1987) pp. 227–232 (Abstract).

Probst et al. "WSi$_2$ and CoSi$_2$ as Diffusion Sources in Shallow Junction Formation in Si" J Appl. Phys Jul. 1991 vol. 70 No. 2 pp. 708–719 (abstract).

*Primary Examiner*—Olik Chaudhuri
*Assistant Examiner*—C. Everhart
*Attorney, Agent, or Firm*—Raymond L. Owens

[57] ABSTRACT

A method where WSi$_x$ films are used to contact heavily doped, n$^+$ regions in a silicon substrate. The doped regions are formed by ion implantation of an impurity such as arsenic (As). The deposited WSi$_x$ film is annealed prior to the deposition of the aluminum interconnect. This anneal is carried out at typical dopant activation conditions. The procedure results in unexpectedly low resistance for small contact areas of less than 1.7 μm$^2$ when the WSi$_x$ film has a thickness of between 1000 Å and 2500 Å.

3 Claims, 3 Drawing Sheets

METHOD FOR FORMING CONTACTS WITH ANOMALOUSLY LOW RESISTANCE

CROSS-REFERENCE TO RELATED APPLICATION

This is a continuation-in-part of U.S. application Ser. No. 08/016,225 filed Feb. 11, 1993, now abandoned entitled "A Method for Forming Contacts With Anomalously Low Resistance" by Madhav Mehra.

FIELD OF THE INVENTION

This invention relates to a method for the fabrication of anomalously low resistance contacts to a semiconductor device.

BACKGROUND OF THE INVENTION

Patterned thin films of conductive materials are used to form interconnects between different structures of an integrated circuit. The primary requirement for these interconnects is that they be made of a high conductivity material. For example, in silicon based semiconductor devices, metallic films of aluminum, copper and their alloys have been used as interconnects.

When defining the resistance of the interconnect system it is important to consider, in addition to the intrinsic conductivity of the metal, the ability of the metal to make low resistance contacts to the semiconductor. Good contact necessitates an intimate chemical proximity that easily permits the transport of electrons across the interface. Intimate chemical proximity, however, could imply a propensity for a chemical reaction that could, over time or under severe conditions, degrade the performance of the device. Such degradation is seen when aluminum alloy interconnects are used in direct contact with doped silicon surfaces. The degradation, enhanced at high temperatures, takes the form of "junction spiking", a phenomenon in which the silicon dissolves in and is transported through the aluminum. The aluminum in return, "spikes" into the silicon to fill the void left behind by the consumed silicon. To minimize the interaction, the concept of diffusion barriers has been invoked. These are thin layers of conductive films that are placed between the interconnect and the underlying semiconductor. Examples of diffusion barriers in the Al alloy-Si system are titanium-tungsten (TiW), titanium nitride (TiN) and tungsten silicide ($WSi_x$). These diffusion barriers maintain electrical continuity while metallurgically separating the interconnect from the semiconductor.

As the density of the integrated chips has increased, so have the demands on the metallization schemes used. This is particularly emphasized at the contact. The following are requirements of high density integrated chips:

(a) Contacts have had to become smaller. This has increased the resistance per contact. First order scaling theory predicts that contact resistance increases inversely with the area of the contact, i.e., with the square of the critical dimension.

(b) "Scaled devices" also require that the metallurgical depths of the contact be shallower. This requirement further increases the need for diffusion barriers, as now even a lesser amount of spiking may ruin the junction below the contact.

SUMMARY OF THE INVENTION

It is an object of this invention to form contacts with low contact resistance with a silicon substrate.

The object is achieved in a method of forming contacts with low contact resistance to a silicon substrate, comprising the steps of:

(a) providing an $n^+$ region by a dopant in the silicon substrate wherein the dopant concentration is greater than $5 \times 10^{15}/cm^2$;

(b) forming an undoped $WSi_x$ film in contact with the $n^+$ region such $WSi_x$ film having a thickness between 1000 Å and 2500 Å and wherein x is defined by the relationship $2<x<3$ and the film/$n^+$ contact area is less than 1.7 $\mu m^2$;

(c) annealing such $WSi_x$ layer to activate the $n^+$ region; and (d) providing a metal film on the annealed $WSi_x$ film.

A feature of this invention is that it provides unexpectedly low resistance for small contacts.

DETAILED DESCRIPTION OF THE PREFERRED EMBODIMENTS

Figure 1B:
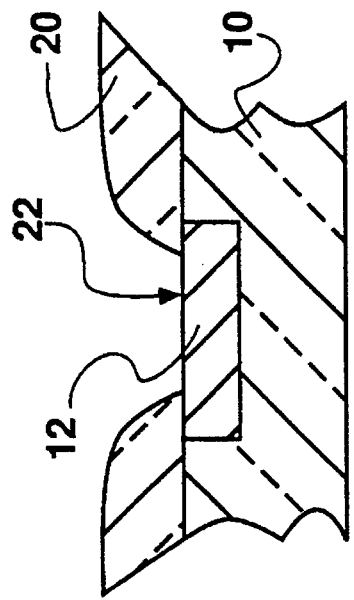
FIGS. 1a–1d show various steps in forming contacts in accordance with the invention.
Figure 1D:
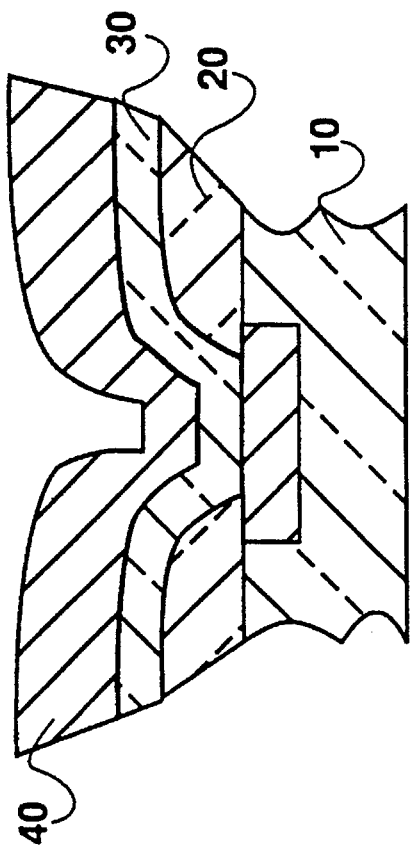
Figure 1A:
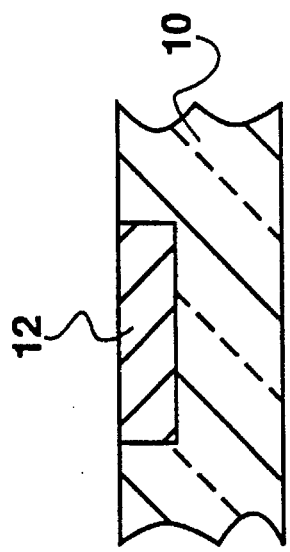
Figure 1C:
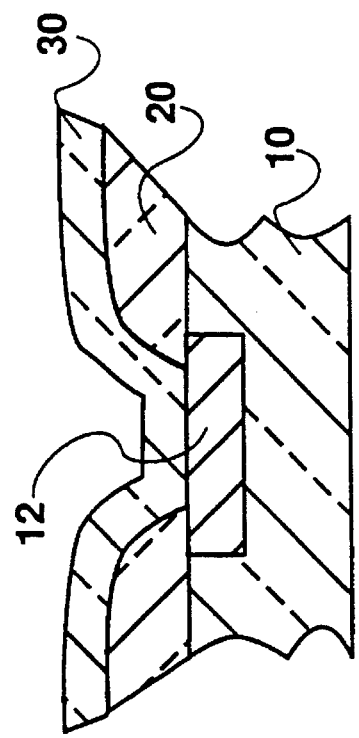

FIGS. 1a–1d show various steps in the method of this invention. Now turning to FIG. 1a, a silicon substrate 10 is provided-with a clean surface. In it, as defined by conventional lithography, is implanted in a doped region 12. This region 12 in this example is typically doped with a dose of arsenic (As) ranging between $2 \times 10^{15} cm^{-2}$ to $5 \times 10^{16} cm^{-2}$. Other dopants can be used in accordance with this invention. FIG. 1b shows the deposition of layer 20, a low temperature dielectric, such as low pressure chemically vapor deposited $SiO_2$ on top of the substrate 10. In this layer 20, a contact window 22 is opened that will be used to connect the metallization to the doped region 12. FIG. 1c shows the deposition of an undoped $WSi_x$ film layer 30 from a target, where x is defined by the relationship $2<x<3$. In accordance with this invention, it has been determined that when $WSi_x$ film layer 30 is undoped, an improvement in contact resistance occurs. The contact area should be less than 1.7 $\mu m^2$. The film 30 has a thickness between 1000 Å and 2500 Å. See FIG. 1b. This composite structure is then annealed at a high temperature (950° C. to 1050° C.) for between 30 to 60 minutes in a furnace. This anneal serves to activate the $n^+$ region as well as form a reaction that is critical for providing the low contact resistance in small contact openings. By activate is meant that the implant in region 12 will become electrically active. Without annealing it is not possible to form electrical contacts. FIG. 1d then shows an Al layer 40 deposited on the $WSi_x$ film 30 and the two are etched contiguously to form the desired interconnects. Although aluminum is a preferred metal, other metals can also be used in accordance with this invention. Preferably, the aluminum layer 40 can be doped with 1% silicon and from 1% to 4% copper. These impurities help to improve the physical integrity as well as increase the reliability of the interconnects.

Figure 2A:
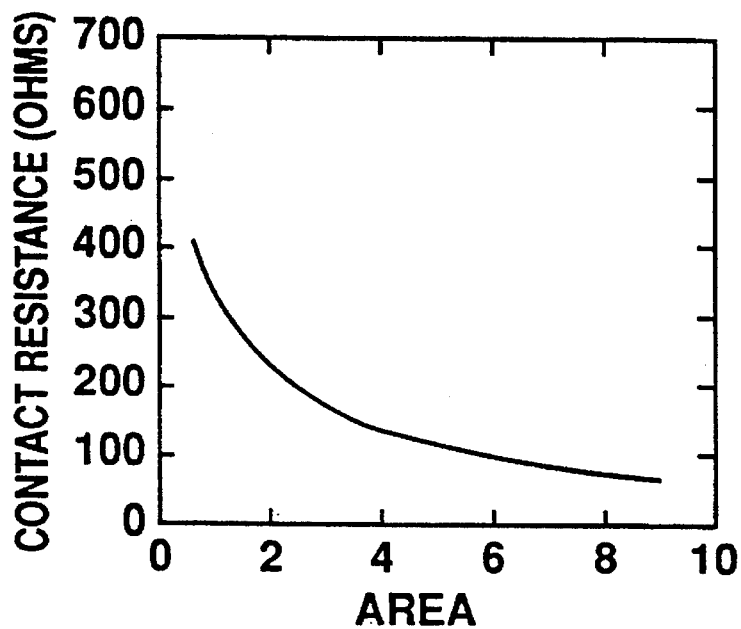
FIG. 2a is a graph showing contact resistance for various size contacts (areas) when the dopant is activated prior to the deposition of the $WSi_x$.
Figure 2B:
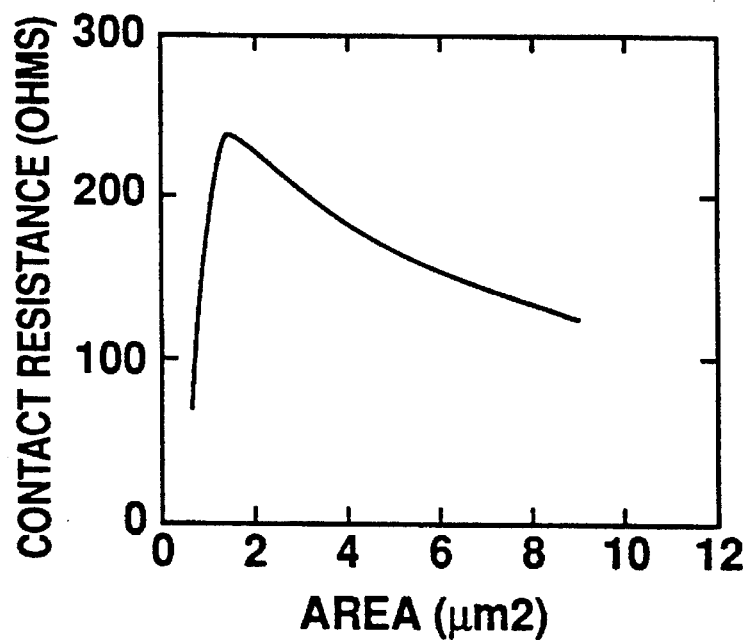
FIG. 2b is a graph similar to FIG. 2a but with the dopant being activated after the contact has been formed and the $WSi_x$ has been deposited.

FIG. 2 shows the results of the described procedure. In FIG. 2a are shown the results for contacts that were annealed prior to the formation of the contact windows. This is the traditional way of activating implants and the results are as expected. The contact resistance increases monotonically with decreasing contact openings. FIG. 2b, however, shows the results when the anneal is carried out after the opening has been formed and the undoped $WSi_x$ film 30 deposited on the $n^+$ region. For larger contact areas between region 12 and the film 30 of greater than about 1.7 $\mu m^2$, the contact resistance behaves normally as shown in FIG. 2a. That is to say, the contact resistance increases as the contact size decreases. For smaller contacts, however, the increase in contact resistance slows down and for extremely small contacts, in this example, about 1.4 $\mu m^2$, the contact resistance actually decreases. Summarizing in FIG. 2b is shown the phenomenon that when the contact area is less than 1.7 $\mu m^2$, the contact resistance significantly drops. In FIG. 2a the normal situation is shown.

Figure 3:
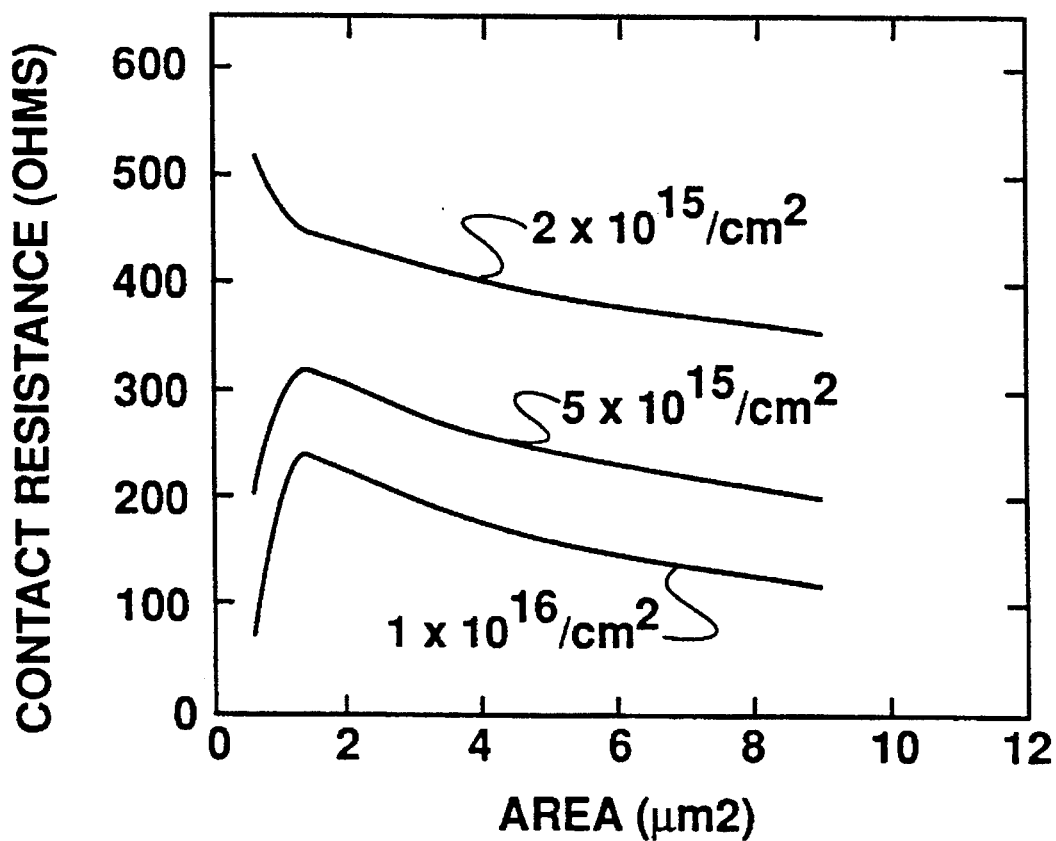
FIG. 3 is a graph showing contact resistance for various size contacts (areas) for different dopant concentrations.

FIG. 3 shows the behavior for the contact resistance with changing doping levels as a parameter. Again, at low doping dose, less than $5 \times 10^{15} cm^{-2}$, the contact resistance behaves normally. When the doping dose is greater than $5 \times 10^{15} cm^{-2}$, a totally unexpected anomalous behavior is exhibited.

The invention has been described in detail with particular reference to certain preferred embodiments thereof, but it will be understood that variations and modifications can be effected within the spirit and scope of the invention.

PARTS LIST

10. silicon substrate
12. doped region
20. layer
22. contact window
30. film layer
40. Al layer

I claim:

1. A method of forming contacts with low contact resistance to a silicon substrate, comprising the steps of:

(a) providing an $n^+$ region by a dopant in the silicon substrate wherein the dopant concentration is greater than $5 \times 10^{15}/cm^2$;

(b) forming an undoped $WSi_x$ film in contact with the $n^+$ region such $WSi_x$ film having a thickness between 1000 Å and 2500 Å and wherein x is defined by the relationship $2<x<3$ and the film/$n^+$ contact area is less than 1.7 $\mu m^2$;

(c) annealing such $WSi_x$ layer to activate the $n^+$ region; and (d) providing a metal film on the annealed $WSi_x$ film.

2. The method of claim 1 wherein annealing is at a temperature of from 950° C. to 1050° C. for a time between 30 to 60 minutes.

3. The method of claim 1 wherein the metal layer is Al and the dopant is As.

\* \* \* \* \*